(12) United States Patent
Johnson (10) Patent No.: US 7,768,436 B2
(45) Date of Patent: Aug. 3, 2010

(54) METHOD AND STRUCTURE FOR IMPLEMENTING A RESISTOR LADDER

(75) Inventor: Wade G. Johnson, Oxford, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 8 days.

(21) Appl. No.: 12/362,177

(22) Filed: Jan. 29, 2009

(65) Prior Publication Data

US 2009/0134890 A1    May 28, 2009

Related U.S. Application Data (63) Continuation-in-part of application No. 11/852,471, filed on Sep. 10, 2007, now Pat. No. 7,511,651.

(51) Int. Cl.
  *H03M 1/12*   (2006.01)
(52) U.S. Cl. ..................... 341/155; 180/271
(58) Field of Classification Search ............. 341/155; 180/271, 287; 324/713; 318/280, 264, 283, 318/406, 446, 466, 480; 701/36
  See application file for complete search history.

(56) References Cited

U.S. PATENT DOCUMENTS 6,051,945 A * 4/2000 Furukawa ................ 318/280
6,762,693 B2   7/2004 Wand
7,265,699 B1   9/2007 Johnson et al.

* cited by examiner

*Primary Examiner*—Rexford N Barnie
*Assistant Examiner*—Joseph Lauture
(74) *Attorney, Agent, or Firm*—Ingrassia Fisher & Lorenz, P.C.

(57) ABSTRACT

An switching interface is provided for use on a vehicle. In an exemplary embodiment the switching interface comprises a receiver and a switch assembly. The receiver may include an input node; a regulated power supply electrically couple to the input node; and an analog-to-digital (A/D) converter configured to measure a voltage potential between the input node and the receiver ground. The switch assembly may include a first resistor electrically coupled to the receiver input node, the first resistor having a first resistive value; a first switch electrically coupled between the first resistor and a switch assembly ground; a second resistor electrically coupled to the first resistor and the first switch, the second resistor having a second resistive value; and a second switch coupled between the second resistor and the switch assembly ground. The first and second resistive values may be selected such that the switch assembly has a separate switch assembly state for each switch with an associated voltage potential measured between the input node and ground for each of the switch assembly states.

20 Claims, 7 Drawing Sheets

| | | 408A | 408B | 408C | 408D | 408E | 408F | 408G | 408H | 408I | 408J | 408K |
|---|---|---|---|---|---|---|---|---|---|---|---|---|
| | Number of Resistors Functions or States | 2 local (1 to 3) | 3 local (2 to 4) | 4 local (3 to 5) | 5 (4 to 6) | 6 (5 to 7) | 7 (6 to 8) | 8 (7 to 9) | 9 (8 to 10) | 10 (9 to 11) | 11 (10 to 12) | 12 (11 to 13) |
| 402 Resistor Ladder Values | R1[Ω] | 187 | 182 | 169 | 97.6 | 97.6 | 97.6 | 97.6 | 97.6 | 97.6 | 47.5 | 40.2 |
| | R2[Ω] | 1870 | 698 | 365 | 340 | 226 | 162 | 110 | 82.5 | 59 | 46.4 | 42.2 |
| | R3[Ω] | | 1870 | 787 | 499 | 316 | 215 | 147 | 107 | 76.8 | 59 | 53.6 |
| | R4[Ω] | | | 2100 | 845 | 475 | 309 | 200 | 143 | 100 | 75 | 68.1 |
| | R5[Ω] | | | | 1870 | 825 | 475 | 287 | 200 | 137 | 100 | 86.6 |
| | R6[Ω] | | | | | 1870 | 825 | 453 | 294 | 191 | 133 | 115 |
| | R7[Ω] | | | | | | 1870 | 806 | 464 | 280 | 191 | 154 |
| | R8[Ω] | | | | | | | 1870 | 825 | 453 | 280 | 221 |
| | R9[Ω] | | | | | | | | 1870 | 806 | 442 | 324 |
| | R10[Ω] | | | | | | | | | 1870 | 806 | 523 |
| | R11[Ω] | | | | | | | | | | 1870 | 953 |
| | R12[Ω] | | | | | | | | | | | 2260 |
| | Rswitch[Ω] | <=100 | <=100 | <=20 (1) | <=100 | <=100 | <=20 | <=20 | <=20 | <=20 | <=20 | <=20 |
| 404 Receiver | Rpu[Ω] | 280 | 280 | 280 | 280 | 280 | 280 | 280 | 280 | 280 | 280 | 280 |
| | Rpd[Ω] | 49.9k | 49.9k | 49.9k | 49.9k | 49.9k | 49.9k | 49.9k | 49.9k | 49.9k | 49.9k | 49.9k |
| | Rad[Ω] | 10.0k | 10.0k | 10.0k | 10.0k | 10.0k | 10.0k | 10.0k | 10.0k | 10.0k | 10.0k | 10.0k |
| | Rpu_sw[Ω] | 0-10 | 0-10 | 0-10 | 0-10 | 0-10 | 0-10 | 0-10 | 0-10 | 0-10 | 0-10 | 0-10 |
| | Cad[nF] | 100 | 100 | 100 | 100 | 100 | 100 | 100 | 100 | 100 | 100 | 100 |
| | Cin[nF] | 10 | 10 | 10 | 10 | 10 | 10 | 10 | 10 | 10 | 10 | 10 |
| | 5V Supply Error [%] | ±4% | ±4% | ±4% | ±4% | ±4% | ±4% | ±4% | ±4% | ±4% | ±4% | ±4% |
| | 5V Track Error [mV] | ±20mV | ±20mV | ±20mV | ±20mV | ±20mV | ±20mV | ±20mV | ±20mV | ±20mV | ±20mV | ±20mV |
| | A/D error [10bit] | ±4 LSB | ±4 LSB | ±4 LSB | ±4 LSB | ±4 LSB | ±4 LSB | ±4 LSB | ±4 LSB | ±4 LSB | ±4 LSB | ±4 LSB |
| | A/D Leakage [mA] | ±1µA | ±1µA | ±1µA | ±1µA | ±1µA | ±1µA | ±1µA | ±1µA | ±1µA | ±1µA | ±1µA |
| 406 System | Ropen[Ω] | >=100k | >=100k | >=100k | >=100k | >=100k | >=100k | >=100k | >=100k | >=100k | >=100k | >=100k |
| | Rharness[Ω] | <=1 | <=1 | <=1 | <=1 | <=1 | <=1 | <=1 | <=1 | <=1 | <=1 | <=1 |
| | Rshort[Ω] | <=100m | <=100m | <=100m | <=100m | <=100m | <=100m | <=100m | <=100m | <=100m | <=100m | <=100m |
| | Vshort[V] | no (+/-1V) | no (+/-1V) | no (+/-1V) | <=1 | <=1 | <=1 | <=1 | <=1 | <=1 | <=1 | <=1 |
| | GND Return [y/n] | | | | yes | yes | yes | yes | yes | yes | yes | yes |
| | Inom at Max R[mA] | 2.13 | 1.65 | 1.3 | 1.27 | 1.22 | 1.18 | 1.17 | 1.14 | 1.15 | 1.15 | 1 |

(1) <=20Ω for switch keypad local ground connection or <=100Ω for switch keypad ground return to receiver.

FIG. 4

| Resistors States 502 | 508A 2 local (1 to 3) | 508B 3 local (2 to 4) | 508C 4 local (3 to 5) | 508D 5 (4 to 6) | 508E 6 (5 to 7) | 508F 7 (6 to 8) | 508G 8 (7 to 9) | 508H 9 (8 to 10) | 508I 10 (9 to 11) | 508J 11 (10 to 12) | 508K 12 (11 to 13) |
|---|---|---|---|---|---|---|---|---|---|---|---|
| | Short G(1) 1.147 SW1 4.078 SW2 (2) 4.735 OPEN/B(3) | Short G(1) 1.137 SW1 3.324 SW2 4.265 SW3 (2) 4.755 OPEN/B(3) | Short G(1) 1.069 SW1 2.735 SW2 3.775 SW3 4.402 SW4 (2) 4.775 OPEN/B(3) | Short G(1) 1.137 SW1 2.843 SW2 3.657 SW3 4.147 SW4 4.490 SW5 (2) 4.755 OPEN/B(3) | Short G(1) 1.137 SW1 2.471 SW2 3.275 SW3 3.814 SW4 4.206 SW5 4.510 SW6 (2) 4.755 OPEN/B(3) | Short G(1) 1.137 SW1 2.206 SW2 2.941 SW3 3.490 SW4 3.922 SW5 4.255 SW6 4.529 SW7 (2) 4.765 OPEN/B(3) | Short G(1) 1.137 SW1 1.941 SW2 2.588 SW3 3.118 SW4 3.569 SW5 3.941 SW6 4.255 SW7 4.529 SW8 (2) 4.765 OPEN/B(3) | Short G(1) 1.137 SW1 1.775 SW2 2.343 SW3 2.833 SW4 3.275 SW5 3.647 SW6 3.990 SW7 4.284 SW8 4.539 SW9 (2) 4.765 OPEN/B(3) | Short G(1) 1.137 SW1 1.608 SW2 2.078 SW3 2.520 SW4 2.941 SW5 3.314 SW6 3.667 SW7 4.000 SW8 4.275 SW9 4.529 SW10 (2) 4.765 OPEN/B(3) | Short G(1) 0.598 SW1 1.098 SW2 1.588 SW3 2.049 SW4 2.490 SW5 2.912 SW6 3.294 SW7 3.667 SW8 3.980 SW9 4.275 SW10 4.529 SW11 (2) 4.765 OPEN/B(3) | Short G(1) 0.520 SW1 0.990 SW2 1.461 SW3 1.931 SW4 2.363 SW5 2.775 SW6 3.147 SW7 3.500 SW8 3.814 SW9 4.108 SW10 4.363 SW11 4.598 SW12 (2) 4.794 OPEN/B(3) |

Example for 2 resistors (n=2):
if    0.000   <=voltage<   1.147   , Then   Short G(1)
if    1.147   <=voltage<   4.078   , Then   SW1
if    4.078   <=voltage<   4.735   , Then   SW2 (2)
if    4.735   <=voltage<   infinity , Then   OPEN/B(3)

(1) This voltage range represents short circuit to GND or SW0 closed.
(2) This voltage range represents SWn closed or a connected switch assembly.
(3) This voltage range represents an open circuit or a signal short to battery.

FIG. 5

| | | 608A | 608B | 608C | 608D | 608E | 608F | 608G | 608H | 608I | 608J | 608K | 608L |
|---|---|---|---|---|---|---|---|---|---|---|---|---|---|
| | Number of Resistors Functions or States | 2 local (1 to 3) | 3 local (2 to 4) | 4 local (3 to 5) | 4 (3 to 5) | 5 (4 to 6) | 6 (5 to 7) | 7 (6 to 8) | 8 (7 to 9) | 9 (8 to 10) | 10 (9 to 11) | 11 (10 to 12) | 12 (11 to 13) |
| 602 Resistor Ladder Values | R1[Ω] | 232 | 191 | 162 | 130 | 115 | 105 | 113 | 102 | 64.9 | 60.4 | 48.7 | 40.2 |
| | R2[Ω] | 976 | 619 | 348 | 249 | 205 | 182 | 88.7 | 78.7 | 63.4 | 54.9 | 48.7 | 42.2 |
| | R3[Ω] | | 1690 | 750 | 453 | 324 | 261 | 127 | 107 | 84.5 | 71.5 | 61.9 | 53.6 |
| | R4[Ω] | | | 2100 | 1150 | 590 | 412 | 196 | 154 | 115 | 95.3 | 80.6 | 68.1 |
| | R5[Ω] | | | | | 1470 | 732 | 316 | 237 | 165 | 130 | 105 | 86.6 |
| | R6[Ω] | | | | | | 1740 | 604 | 392 | 249 | 182 | 143 | 115 |
| | R7[Ω] | | | | | | | 1540 | 750 | 402 | 274 | 205 | 154 |
| | R8[Ω] | | | | | | | | 1910 | 750 | 453 | 309 | 221 |
| | R9[Ω] | | | | | | | | | 1870 | 845 | 499 | 324 |
| | R10[Ω] | | | | | | | | | | 2050 | 931 | 523 |
| | R11[Ω] | | | | | | | | | | | 2370 | 953 |
| | R12[Ω] | | | | | | | | | | | | 2260 |
| | Rswitch[Ω] | <=100 | <=100 | <=20 (1) | <=100 | <=100 | <=100 | <=20 | <=20 | <=20 | <=20 | <=20 | <=20 |
| 604 Receiver | Rpu[Ω] | 280 | 280 | 280 | 280 | 280 | 280 | 280 | 280 | 280 | 280 | 280 | 280 |
| | Rpd[Ω] | 49.9k | 49.9k | 49.9k | 49.9k | 49.9k | 49.9k | 49.9k | 49.9k | 49.9k | 49.9k | 49.9k | 49.9k |
| | Rad[Ω] | 10.0k | 10.0k | 10.0k | 10.0k | 10.0k | 10.0k | 10.0k | 10.0k | 10.0k | 10.0k | 10.0k | 10.0k |
| | Rpu_sw[Ω] | 0-10 | 0-10 | 0-10 | 0-10 | 0-10 | 0-10 | 0-10 | 0-10 | 0-10 | 0-10 | 0-10 | 0-10 |
| | Cad[nF] | 100 | 100 | 100 | 100 | 100 | 100 | 100 | 100 | 100 | 100 | 100 | 100 |
| | Cin[nF] | 10 | 10 | 10 | 10 | 10 | 10 | 10 | 10 | 10 | 10 | 10 | 10 |
| | 5V Supply Error [%] | ±4% | ±4% | ±4% | ±4% | ±4% | ±4% | ±4% | ±4% | ±4% | ±4% | ±4% | ±4% |
| | 5V Track Error [mV] | ±20mV | ±20mV | ±20mV | ±20mV | ±20mV | ±20mV | ±20mV | ±20mV | ±20mV | ±20mV | ±20mV | ±20mV |
| | A/D error [10bit] | ±4 LSB | ±4 LSB | ±4 LSB | ±4 LSB | ±4 LSB | ±4 LSB | ±4 LSB | ±4 LSB | ±4 LSB | ±4 LSB | ±4 LSB | ±4 LSB |
| | A/D Leakage [μA] | ±1μA | ±1μA | ±1μA | ±1μA | ±1μA | ±1μA | ±1μA | ±1μA | ±1μA | ±1μA | ±1μA | ±1μA |
| 606 System | Ropen[Ω] | >=100k | >=100k | >=100k | >=100k | >=100k | >=100k | >=100k | >=100k | >=100k | >=100k | >=100k | >=100k |
| | Rharness[Ω] | <=1 | <=1 | <=1 | <=1 | <=1 | <=1 | <=1 | <=1 | <=1 | <=1 | <=1 | <=1 |
| | Rshort[Ω] | <=100m | <=100m | <=100m | <=100m | <=100m | <=100m | <=100m | <=100m | <=100m | <=100m | <=100m | <=100m |
| | Vshort[V] | no (+/-1V) | <=1 | <=0.9 | <=1 | <=1 | <=1 | <=1 | <=1 | <=0.6 | <=0.6 | <=0.5 | <=0.5 |
| | GND Return [y/n] | no (+/-1V) no (+/-0.9V) | yes | yes | yes | yes | yes | yes | yes | yes | yes | yes | yes |
| | Inom at Max R[mA] | 3.3 | 1.8 | 1.4 | 2.2 | 1.7 | 1.3 | 1.5 | 1.2 | 1.2 | 1.1 | 1.0 | 1.0 |

(1) <=20Ω for switch keypad local ground connection or <=100Ω for switch keypad ground return to receiver.

FIG. 6

| Resistors States 702 | 708A 2 local (1 to 3) | 708B 3 local (2 to 4) | 708C 4 local (3 to 5) | 708D 4 (3 to 5) | 708E 5 (4 to 6) | 708F 6 (5 to 7) | 708G 7 (6 to 8) | 708H 8 (7 to 9) | 708I 9 (8 to 10) | 708J 10 (9 to 11) | 708K 11 (10 to 12) | 708L 12 (11 to 13) |
|---|---|---|---|---|---|---|---|---|---|---|---|---|
| | Short G(1) | Short G(1) | Short G(1) | Short G(1) | Short G(1) | Short G(1) | Short G(1) | Short G(1) | Short G(1) | Short G(1) | Short G(1) | Short G(1) |
| | 1.098 | 1.118 | 1.000 | 1.118 | 1.118 | 1.118 | 1.118 | 1.059 | 0.706 | 0.686 | 0.588 | 0.510 |
| | 1.490 | 1.216 | 1.059 | 1.392 | 1.275 | 1.196 | 1.255 | 1.157 | 0.784 | 0.745 | 0.628 | 0.529 |
| | SW1 | SW1 | SW1 | SW1 | SW1 | SW1 | SW1 | SW1 | SW1 | SW1 | SW1 | SW1 |
| | 3.294 | 3.157 | 2.647 | 2.392 | 2.314 | 2.255 | 1.765 | 1.667 | 1.314 | 1.235 | 1.098 | 0.980 |
| | 3.686 | 3.255 | 2.706 | 2.667 | 2.471 | 2.333 | 1.902 | 1.765 | 1.392 | 1.294 | 1.137 | 1.000 |
| | SW2 | SW2 | SW2 | SW2 | SW2 | SW2 | SW2 | SW2 | SW2 | SW2 | SW2 | SW2 |
| | SW2 (2) | 4.157 | 3.686 | 3.294 | 3.137 | 3.039 | 2.353 | 2.235 | 1.882 | 1.765 | 1.608 | 1.451 |
| | 4.392 | 4.255 | 3.745 | 3.569 | 3.294 | 3.118 | 2.490 | 2.333 | 1.961 | 1.824 | 1.647 | 1.471 |
| | 4.784 | SW3 (2) | SW3 | SW3 | SW3 | SW3 | SW3 | SW3 | SW3 | SW3 | SW3 | SW3 |
| | OPEN/B(3) | 4.686 | 4.353 | 3.961 | 3.745 | 3.608 | 2.922 | 2.765 | 2.412 | 2.255 | 2.078 | 1.922 |
| | | 4.784 | 4.412 | 4.235 | 3.902 | 3.686 | 3.059 | 2.863 | 2.490 | 2.314 | 2.118 | 1.941 |
| | | OPEN/B(3) | SW4 (2) | SW4 (2) | SW4 | SW4 | SW4 | SW4 | SW4 | SW4 | SW4 | SW4 |
| | | | 4.745 | 4.490 | 4.235 | 4.059 | 3.431 | 3.255 | 2.922 | 2.726 | 2.529 | 2.353 |
| | | | 4.804 | 4.765 | 4.392 | 4.137 | 3.569 | 3.353 | 3.000 | 2.784 | 2.569 | 2.373 |
| | | | OPEN/B(3) | OPEN/B(3) | SW5 (2) | SW5 | SW5 | SW5 | SW5 | SW5 | SW5 | SW5 |
| | | | | | 4.628 | 4.412 | 3.882 | 3.686 | 3.373 | 3.157 | 2.961 | 2.765 |
| | | | | | 4.784 | 4.490 | 4.020 | 3.784 | 3.451 | 3.216 | 3.000 | 2.784 |
| | | | | | OPEN/B(3) | SW6 (2) | SW6 | SW6 | SW6 | SW6 | SW6 | SW6 |
| | | | | | | 4.706 | 4.294 | 4.078 | 3.765 | 3.549 | 3.353 | 3.137 |
| | | | | | | 4.784 | 4.431 | 4.177 | 3.843 | 3.608 | 3.392 | 3.157 |
| | | | | | | OPEN/B(3) | SW7 (2) | SW7 | SW7 | SW7 | SW7 | SW7 |
| | | | | | | | 4.647 | 4.431 | 4.137 | 3.902 | 3.706 | 3.490 |
| | | | | | | | 4.784 | 4.529 | 4.216 | 3.961 | 3.745 | 3.510 |
| | | | | | | | OPEN/B(3) | SW8 (2) | SW8 | SW8 | SW8 | SW8 |
| | | | | | | | | 4.726 | 4.451 | 4.235 | 4.020 | 3.804 |
| | | | | | | | | 4.824 | 4.529 | 4.294 | 4.059 | 3.824 |
| | | | | | | | | OPEN/B(3) | SW9 (2) | SW9 | SW9 | SW9 |
| | | | | | | | | | 4.726 | 4.510 | 4.314 | 4.098 |
| | | | | | | | | | 4.804 | 4.569 | 4.353 | 4.118 |
| | | | | | | | | | OPEN/B(3) | SW10 (2) | SW10 | SW10 |
| | | | | | | | | | | 4.745 | 4.569 | 4.353 |
| | | | | | | | | | | 4.804 | 4.608 | 4.373 |
| | | | | | | | | | | OPEN/B(3) | SW11 (2) | SW11 |
| | | | | | | | | | | | 4.784 | 4.588 |
| | | | | | | | | | | | 4.824 | 4.608 |
| | | | | | | | | | | | OPEN/B(3) | SW12 (2) |
| | | | | | | | | | | | | 4.784 |
| | | | | | | | | | | | | 4.804 |
| | | | | | | | | | | | | OPEN/B(3) |

States and Voltage Calibrations

Example for 2 resistors (n=2):
- if 0.000 <=voltage< 1.098 , Then Short G(1)
- if 1.098 <=voltage< 1.490 , Then Deadband
- if 1.490 <=voltage< 3.294 , Then SW1
- if 3.294 <=voltage< 3.686 , Then Deadband
- if 3.686 <=voltage< 4.392 , Then SW2 (2)
- if 4.392 <=voltage< 4.784 , Then Deadband
- if 4.784 <=voltage< infinity , Then OPEN/B(3)

(1) This voltage range represents short circuit to GND or SW0 closed.
(2) This voltage range represents SWn closed or a connected switch assembly.
(3) This voltage range represents an open circuit or a signal short to battery.

METHOD AND STRUCTURE FOR IMPLEMENTING A RESISTOR LADDER

CROSS-REFERENCE TO RELATED APPLICATIONS

This application is a continuation-in-part of pending U.S. non-provisional application Ser. No. 11/852,471 filed Sep. 10, 2007, which is incorporated herein by reference.

TECHNICAL FIELD

The following description generally relates to resistor ladder networks, and more particularly relates to a resistor ladder for use in a vehicle.

BACKGROUND

Resistor ladder networks typically comprise a plurality of resistors and a plurality of switches disposed such that closing any one of the switches alters either the high resistance or the low resistance of a voltage divider circuit. The voltage divider circuit is comprised of a high resistance between a supply voltage and an output terminal and a low resistance between the output terminal and a low voltage reference. The resistor ladder is substituted for either the high resistance or low resistance in the voltage divider network. In this way, the resistance of the network is a variable and will exhibit a unique resistance range depending upon the selected state of the switch. Thus, the output voltage of the voltage divider is indicative of that, if any, of the switches are closed (e.g., user switch selection). Resistor ladder networks are increasingly used in vehicular applications due to their flexibility of implementation and cost savings.

It is desirable to implement a resistor ladder and switching interface that can provide increased reliability and accuracy. Furthermore, other desirable features and characteristics will become apparent from the subsequent detailed description and the appended claims, taken in conjunction with the accompanying drawings and the foregoing technical field and background.

SUMMARY

A switching interface is provided for use on a vehicle. In an exemplary embodiment the switching interface comprises a receiver and a switch assembly. The receiver may include an input node; a regulated power supply electrically coupled to the input node; and an analog-to-digital (A/D) converter configured to measure a voltage potential between the input node and the receiver ground. The switch assembly may include a first resistor electrically coupled to the receiver input node, the first resistor having a first resistive value; a first switch electrically coupled between the first resistor and a switch assembly ground; a second resistor electrically coupled to the first resistor and the first switch, the second resistor having a second resistive value; and a second switch coupled between the second resistor and the switch assembly ground.

The first and second resistive values may be selected such that the switch assembly has a separate switch assembly state for each switch with an associated voltage potential measured between the input node and ground for each of the switch assembly states.

A method is provided for designing a switching interface. The switching interface in an exemplary embodiment comprising: a receiver and a switch assembly having multiple resistors and multiple switches, the receiver comprising: an input node; a regulated power supply electrically coupled to the input node; and an analog-to-digital (A/D) converter configured to measure a voltage potential between the input node and the receiver ground. The method comprises receiving component values for the receiver; receiving component value variation tolerances for the switching interface; receiving parameters including a total number of resistors in the switch assembly, a total number of switches in the switch assembly, switch state voltage ranges and deadbands voltage ranges between switch states of the switch assembly.

The method also comprises adjusting values of the resistors in the switch assembly; calculating switch state voltage ranges based on the adjusted resistor values and the component value variation tolerances; determining if the switching interface with the adjusted resistor values are within the parameters; continuing to adjust resistor values until the switching interface meets the parameters.

DESCRIPTION OF THE DRAWINGS

A more complete understanding of the subject matter may be derived by referring to the detailed description and claims when considered in conjunction with the following figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

In one embodiment an assembly of keys in a key pad (or multiple keypads) is placed in a steering wheel assembly connected to switches. Rather than using multiple wires to connect multiple switches to a processor, a switch assembly may be implemented that uses relatively few wires for electrical connections from one general location, such as on the steering wheel assembly. For the purpose of simplicity the following discussion will focus primarily on a switch assembly in a steering wheel; the principles discussed below, however, may be applied to other switch assemblies in other areas such as an overhead operator console for operating a sun roof and other items, a dashboard console, a steering column console for operating switches connected to the steering column, as well as switch assemblies in other areas for operating other systems.

One challenge in implementing a resistor ladder switching assembly is that the actual resistor values in a resistor ladder and other components in a system connected to the resistor ladder may be different from the nominal value, and may change over time, thereby changing the output voltage when a switch is closed. In an exemplary embodiment a system is implemented with switch states, and calibrated ranges that are able to tolerate variations in resistor values and other system variations.

A switching interface may be implemented to interpret a voltage related to the state of a switch assembly. A receiver module may compare a reference voltage with a voltage drop as a result of a particular state of the switch assembly. A set of various ranges, such as voltage comparison ranges, may be indicative of a state of the switch assembly. The switch assembly may be coupled to the receiver. The switching interface allows a single switch assembly to include multiple switches with a relatively low number of connecting wires.

Figure 1:
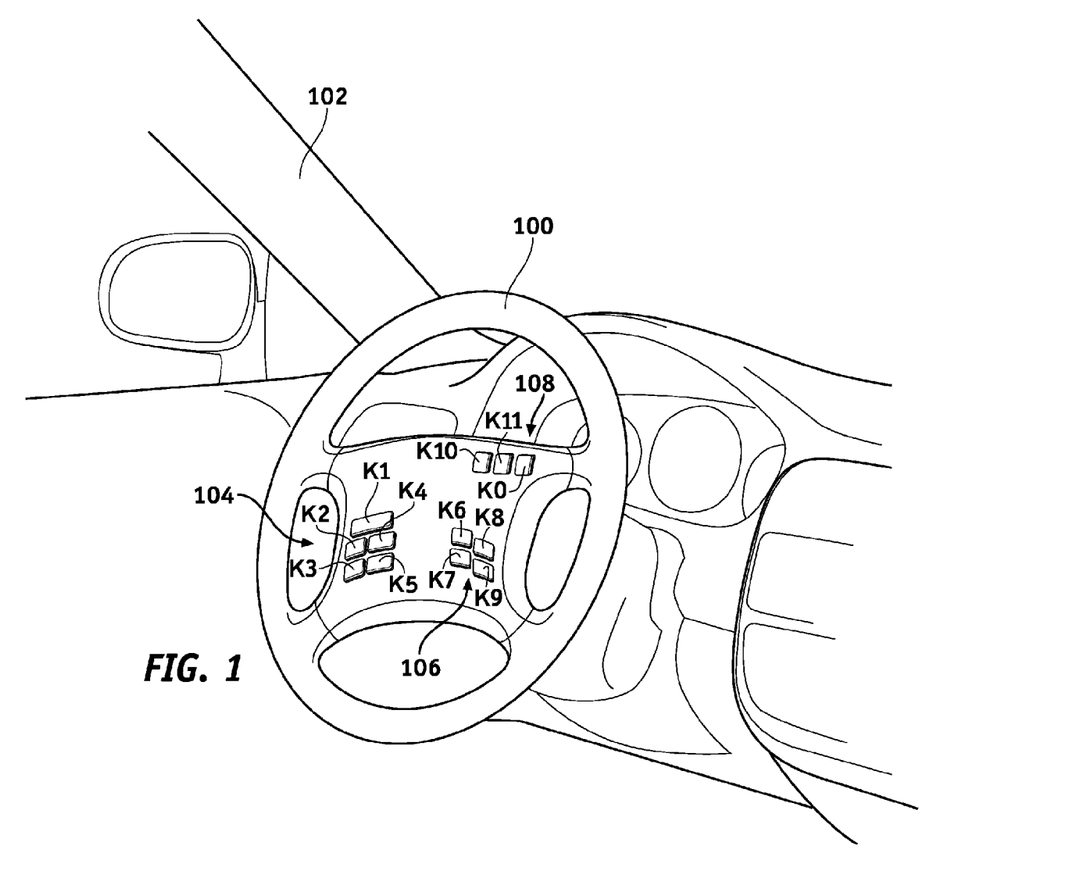
FIG. 1 is a perspective view of a vehicle steering wheel with keys according to an exemplary embodiment.

FIG. 1 is an isometric view of a steering wheel assembly 100 deployed on a vehicle 102. A user interface in the exemplary embodiment comprises twelve keys K0-K11 deployed on a portion of steering wheel assembly 100. Keys K0-K11 may be separated into various switch clusters, and each switch cluster may control a different vehicular feature or different aspects of the same vehicular feature. As shown in FIG. 1, for example, keys K1-K5 may be employed in a left hand key cluster 104 and configured to control the vehicle's audio system, keys K6-K9 may be employed in a right hand key cluster 106 and configured to control an onboard telephone system, and keys K10, K11, and K0 may be employed in an upper key cluster 108 and configured to control a cruise control system. Keys (K0-K11) may be arranged in other arrangements and in other groupings or clusters. Additional keys may also be used to control other features. As will be explained more fully below, keys K0-K11 may be monitored by a suitable onboard processor (e.g., a processor associated with the vehicle's body control module, radio, instrument control panel, etc.) to determine if a user (e.g., a driver of vehicle 102) has depressed or activated any of the keys in cluster 104, cluster 106, cluster 108 and/or in another cluster. Keys K0-K11 may be connected to activate switches so that when a key is pressed a switch is closed and a processor may recognize the closed switch state.

Figure 2:
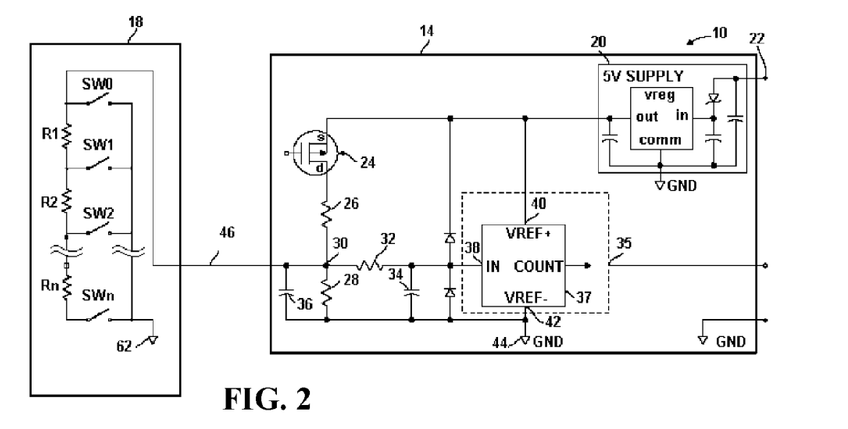
FIG. 2 is a circuit diagram of an exemplary switching interface.

FIG. 2 illustrates an exemplary receiver regulated five volt (5V) switch interface 10 in a schematic diagram that can be deployed in vehicle 102. Various supply voltages (e.g., three volts), whether they be constant or variable, are contemplated. Switch interface 10 includes a resistor ladder switch assembly 18 coupled to a receiver module 14 that performs voltage comparisons to determine a respective state of incorporated switches (SW0-SWn) in the ladder network (e.g., resistors R1 to Rn). The receiver module 14 includes processor 35 that uses analog to digital (A/D) conversion to perform the respective voltage comparisons. The voltage comparisons compare a reference voltage (regulated in the instant case) with a filtered input voltage across the ladder network (e.g., resistors R1, R2, to Rn). Depending on the voltage seen, a series of predetermined switch states can be registered in the processor 35 of receiver module 14.

Switch assembly 18 may have any number of resistors and switches. FIG. 2 shows resistor Rn as a resistor that is connected in series furthest from input node 30. Additional resistors may be included with "n" in "Rn" representing the total number of resistors in switch assembly 18. Similarly, switch assembly 18 may include additional switches associated with the number of resistors.

In an exemplary embodiment a 5V voltage supply regulator device 20 is integrated into receiver module 14 that receives a vehicle supply voltage through terminal 22. The vehicle supply voltage may be a supply voltage comprising the battery of a conventional twelve volt automotive electrical system. In the exemplary embodiment, the vehicle supply voltage is then delivered through a supply switch 24 and through pull up resistor 26 to input node 30. Input node 30 may be electrically connected through conductor 46 to an input/output terminal of switch assembly 18.

Receiver 14 may interpret the differences in voltages when one of the switches (SW0-SWn) is closed. In the exemplary embodiment conductor 46 is coupled to an input/output terminal of receiver 14. As shown, receiver 14 includes a processor 35 that may include an analog to digital (A/D) converter 37. A/D converter 37 is coupled to switch assembly 18 through an RC network, including resistors 28, and capacitors 34 and 36. An input terminal 38 of converter 37 compares the input voltage against positive and negative voltage references 40 and 42 (in this case, +/−5V), that is also coupled to ground 44. In one embodiment an unfiltered input voltage is received from switch assembly 18 between input node 30 and receiver ground 44. A filtered input voltage is between input terminal 38 and receiver ground 44, and is filtered through an RC network of resistor 32 and capacitor 34. The calibration values may be based on filtered input voltage at input terminal 38 which is a voltage read by A/D converter 37.

In the exemplary embodiment shown in FIG. 2, positive and negative references 40 and 42 are supplied from 5V supply 20. In other embodiments positive and negative references are supplied by a separate voltage supply that is separate from 5V regulated supply 20. In the exemplary embodiment, switch interface 10 tolerates a difference in voltage between a first power supply and a second power supply of up to about 20 mV. When two power supplies are used, the voltage at switch 24 is a supply voltage and may be different from reference voltage supplied between positive voltage reference 40 and negative voltage reference 42.

Converter 37 receives the filtered input voltage and voltage reference values, converting the filtered input voltage at input terminal 38 to a digital signal suitable for digital processing. Processor 35 utilizes the digital representations of the filtered input voltage relative to the voltage reference values to determine a voltage compensation ratio indicative of a closed switch in switch assembly 18. A particular closed switch corresponds to a particular voltage compensation ratio observed by converter 37. For example, returning to FIG. 2 if switch SW1 is closed, a voltage compensation ratio (e.g., the ratio of the reference voltage to the filtered input voltage seen across the ladder network) will be registered by receiver 14. In the exemplary embodiment, receiver 14 compares the ratio seen at a particular instant in time with a ratio range stored in memory to determine that switch SW1 is closed.

Returning to FIG. 2, one embodiment includes three resistors (e.g., resistors R1, R2, and Rn, with Rn being resistor R3) that provide for detection of two, three, or four states in switch assembly 18 actuated by two, three, or four keys (e.g. keys K0-K3) based on the configuration of switch assembly 18. If two switches and two keys are used with three resistors in switch assembly 18, for example, switch SW0 may be left open and not connected to a key so that receiver 14 interprets a short to ground at input node 30 as a failure state rather than a closed switch. Switches SW1 and SW2 may be connected to keys such as K1 and K2 on steering wheel assembly 100 (FIG. 1).

One embodiment with three resistors is configured with switch SW3 (as switch SWn) omitted, shorted or held closed, so that R3 (Rn) is connected to a switch assembly ground 62. Receiver 14 may then interpret a state with R1, R2 and R3 connected in series between input node 30 and switch assembly ground 62 as a state with all available switches open (no keys pressed). This configuration allows for an open circuit failure analysis of connector 46.

If switch assembly 18 is used with a configuration having three resistors and three keys, then SW0 may be omitted and SWn may be used with a key such as key K3. Alternatively, switch SW0 may be used with resistor R3 (Rn) connected to ground to provide for three switching states with three resistors in switch assembly 18. If switch assembly 18 is used with three resistors and four switches then both SW0 and SW3 (SWn) may be used as switches such as switches connected to keys K0 and K3 available to a driver of vehicle 102. In the same manner as in the example discussed above, switch assembly 18 may be configured with more or fewer resistors, and with more or fewer available switches than resistors.

In exemplary embodiments various numbers of resistors may be used, such as from two to twelve resistors, with each resistor having a nominal resistive value within a range. These values may be selected to create multiple switching states based upon voltages received at input terminal 38 in response to various key presses. The nominal resistor values may be chosen based on factors including the voltage measured at input terminal 38 with all switches open, the total number of resistor used, ground return configuration, calibration ranges for measured voltages as well as other factors. In an exemplary embodiment where two or more resistors are used, the first resistor has a first resistive value between about 40 ohms and 230 ohms, and the second resistor has a second resistive value between about 40 ohms and about 1870 ohms. When three or more resistors are used a third resistor may have a third resistive value between about 50 ohms and about 1870 ohms. When four or more resistors are used a fourth resistor may have a fourth resistive value between about 60 ohms and about 2100 ohms. When five or more resistors are used a fifth resistor may have a fifth resistive value between about 80 ohms to about 1870 ohms. When six or more resistors are used a sixth resistor may have a sixth resistive value between about 110 ohms and about 1870 ohms. When seven or more resistors are used a seventh resistor may have a seventh resistive value between about 150 ohms and about 1870 ohms. When eight or more resistors are used an eighth resistor may have an eighth resistive value between about 220 and about 1910 ohms. When nine or more resistors are used a ninth resistor may have a ninth resistive value between about 320 ohms and about 1870 ohms. When ten or more resistors are used a tenth resistor may have a tenth resistive value between about 520 ohms and about 2050 ohms. When eleven or more resistors are used an eleventh resistor may have an eleventh value between about 950 ohms and about 2370 ohms. A twelfth resistor may have a twelfth resistive value of about 2260 ohms. In the exemplary embodiments the resistor values are coordinated with one another to provide suitable voltage ranges between resistor states.

Variation in system resistances such as contact switch resistance of switches SW1-SWn, pull-up resistor power switch resistance (switch 24), and harness resistance (conductor 46), as well as other resistance, may cause changes in the voltage measured by A/D converter 37. If the measured voltage variations exceed the calibrated ranges for the switch assembly states, then processor 35 may have an incorrect determination of the switch assembly state. In the exemplary embodiment, switch interface 10 robustly tolerates variation in system resistances due to network components, such as increases in the switch resistances (switches SW1-SWn) over time. For example, switch contacts in switch assembly 18 may have a contact resistance of up to 100 ohms. The receiver pull-up resistor power switch resistance (switch 24) may range from zero ohms to 10 ohms. Harness resistance may vary between zero to one ohm. The harness resistance is in addition to the switch assembly resistance and the power switch resistance. In various embodiments, switch interface 10 may have switch currents ranging from about 1 mA to about 18 mA. Higher current may result when input node 30 is shorted to ground (e.g. with switch SW0). In addition, switch interface 10 tolerates short circuit voltages without incorrectly registering switching states. For example, in various embodiments receiver 14 may experience a failure state with a partial short to ground at input node 30. The partial short to ground may result in a voltage of up to about one volt measured at input terminal 38 without registering inappropriate switch assembly states. In other embodiments the tolerance for a voltage due to a short may be a higher or lower voltage than one volt.

In one embodiment, switch assembly 18 includes a local switch assembly ground 62 that connects to a common electrical ground such as through a vehicle chassis. Receiver 14 may have a receiver ground 44, that is also connected to a common electrical ground to thereby provide an indirect electrical connection between receiver ground 44 and switch assembly ground 62. By using an indirect ground through a common ground such as a vehicle chassis, additional resistance and/or voltage may be detected as a change in voltage at input node 30. In the exemplary embodiment switch interface 10 is designed to tolerate a voltage difference of up to about one volt due to the indirect ground path. An exemplary switch assembly 18 that only requires one direct electrical conductor 46 has the advantage of cost savings in the wire, as well as reduced size in intermediate electrical connections such as those common in vehicle steering wheels and harness connections.

In one embodiment switch interface 10 is configured with an indirect ground connection between switch assembly 18 and receiver 14, and is used with keys (e.g. keys K0-K11) in steering wheel assembly 100. Additional devices may also be used in steering wheel assembly 100 such as another switch interface, a horn actuator switch, an air bag, a steering wheel heater and/or other devices. Some or all of the devices in steering wheel assembly 100 may share a ground connection connected to vehicle chassis or another common ground to reduce the number of electrical connections needed between a steering column and steering wheel assembly 100. In other embodiments, switch interface 10 is implemented with a direct electrical ground conductor 49, coupling switch assembly ground 62 to receiver ground 44 as shown in FIG. 3.

Figure 3:
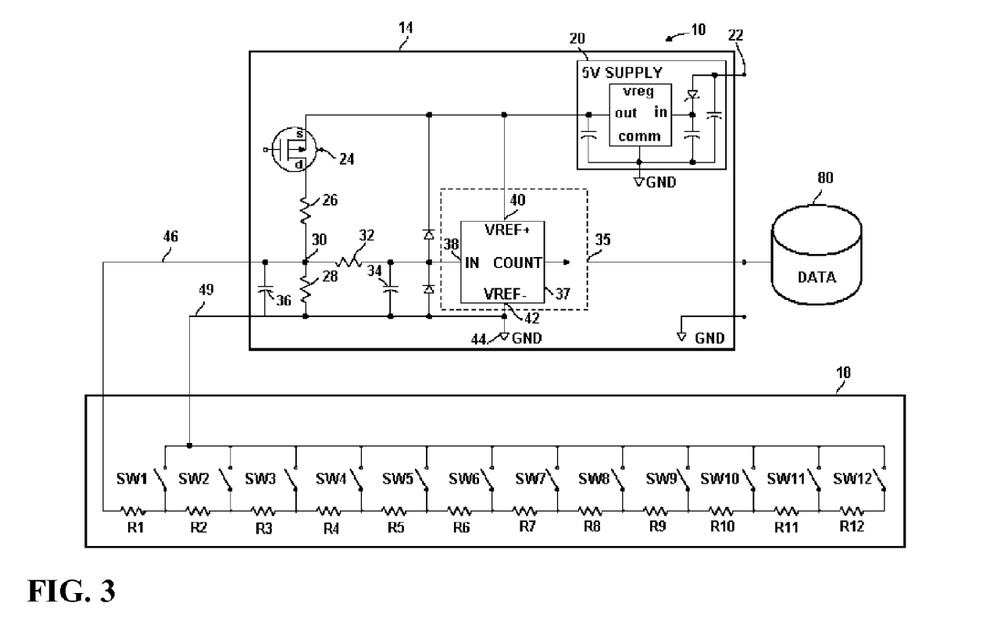
FIG. 3 is a circuit diagram of an exemplary switching interface with twelve switches.

Turning to FIG. 3, an exemplary switch interface 10 is shown with twelve resistors (R1-R12) and twelve switches (SW1-SW12). In the exemplary embodiment the twelve switches (SW1-SW12) are actuated by twelve keys (K0-K11) on steering wheel assembly 100 (FIG. 1). In the exemplary arrangement shown in FIG. 3, receiver 14 detects closed switches one at a time, with the lower number switches having highest priority. In the exemplary embodiment depressing each of twelve different keys (K0-K11) closes each of the twelve different switches (SW1-SW12) and also results in twelve distinct voltages at input terminal 38.

In the exemplary embodiment input terminal 38 of A/D converter 37 receives the voltage related to one of the twelve keys. A/D converter 37 may be part of processor 35 that is communicatively coupled to a memory module 80 that contains a data table. Processor 35 may be coupled to memory module 80 that contains suitable software and/or firmware logic for determining the state of switch assembly 18. The data table in memory module 80, for example, can be used to correlate the depressed key and/or the closed switch with the voltage measured at input terminal 38 using a lookup table. Memory module 80 may be any memory such as random access memory, flash memory, read-only memory, drum memory, magnetic core memory, bubble memory, twistor memory, and/or other types of magnetic or non-magnetic storage.

Figure 4:
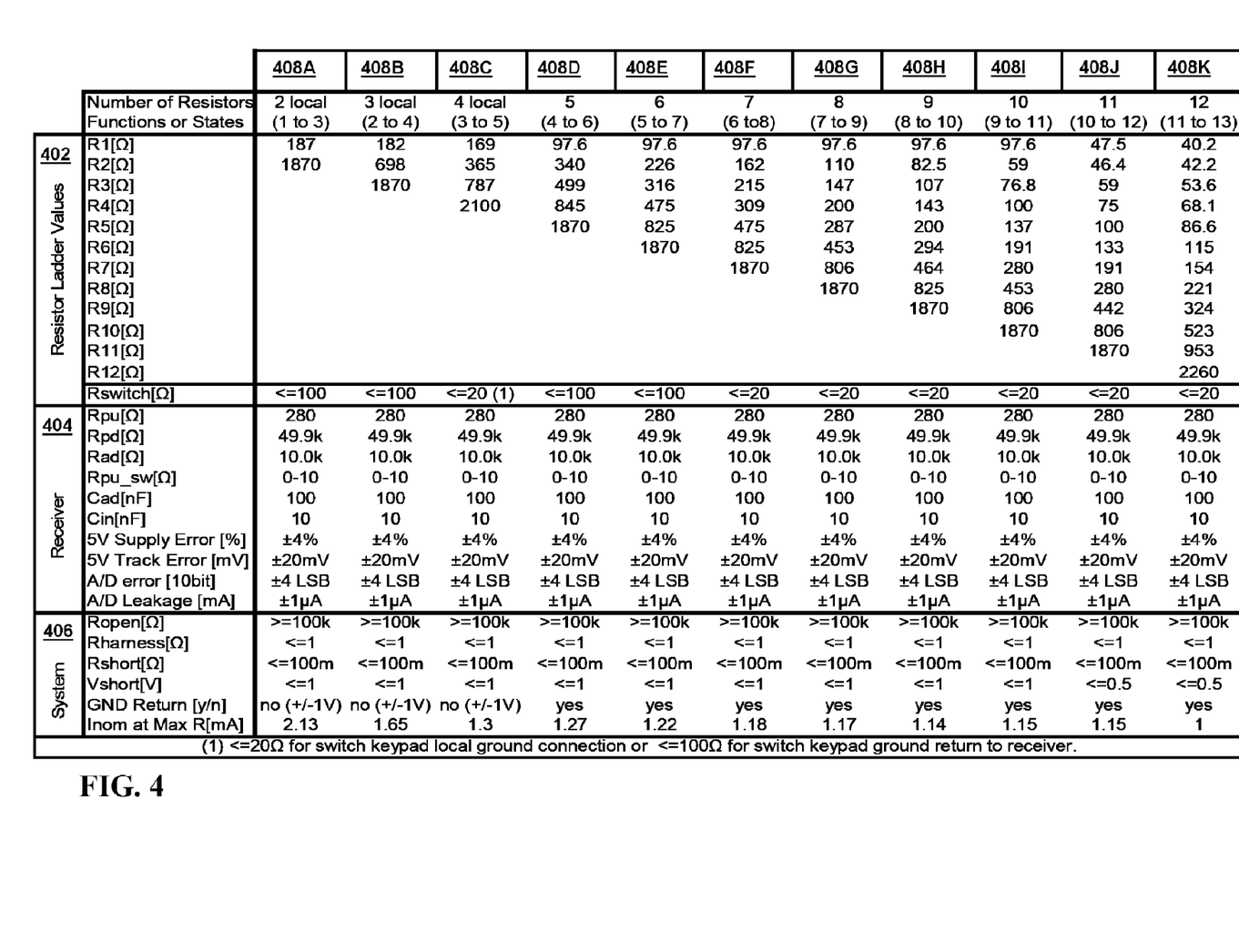
FIG. 4 is table of exemplary values and tolerances for embodiments of a switching interface.

Turning to FIG. 4, a table of exemplary circuit values for switch interface 10 depicted in FIGS. 2 and 3 is shown. FIG. 4 is segmented into three sections 402, 404, and 406. Section 402 shows exemplary resistor values for resistor ladder switch assembly 18, 404 shows exemplary component values and tolerances for receiver 14, and 406 shows exemplary values and tolerances for the system of switch interface 10. Exemplary values for switch assembly 18 are first illustrated in section 402 showing embodiments 408A-408K having two through twelve resistors (R1-R12) in switch assembly 18. Exemplary values of resistors R1-R12 are shown in FIG. 4 for each of the exemplary embodiments. Each of the embodiments has a range of functions or states (e.g. keys K0-K11) that may be used with the exemplary embodiment as reflected by the vertical columns 408A-K in FIG. 4. As discussed above, if shorting switch SW0 is used the switching states may be one more than the number of resistors. Also, as discussed above, if the resistor furthest in series from input node 30 is connected to ground, and a shorting switch is not used, then the number of switch states may be one less than the number of resistors. Arrangements may be used in other embodiments to produce a different number of switching states. The values and tolerances in FIG. 4 are based on the exemplary design shown in FIGS. 2 and 3. Changes in the exemplary design of FIGS. 2 and 3 will result in different values for the exemplary embodiments of resistors and tolerances in FIG. 4.

In the exemplary embodiments shown in FIG. 4 receiver values and tolerances are shown in section 404 of the table. In section 404 receiver values include about 280 ohms for the pull-up resistor 26 (Rpu), about 49.9 k ohms for the pull-down resistor 28 (Rpd), about 10 k ohms for resistor 32 (Rad), between about 0-10 ohms for the resistance of switch 24 (Rpu_sw), and capacitances of about 100 nanofarads for capacitor 34 (Cad) and about 10 nanofarads for capacitor 36 (Cin). In FIG. 4 embodiments 408A-408K may all be used with a receiver having the values as discussed.

The exemplary embodiment may have one or more power supplies such as 5V power supply 20. If the voltage of any of the power supplies is not the same as the nominal voltage, a resulting error may be seen in the measurement by A/D converter 37. Each power supply in the exemplary embodiment may have a voltage within about four percent of the nominal voltage, listed in section 404 as 5V supply error. The exemplary embodiment may also tolerate a difference in the actual values of different power supplies. In one exemplary embodiment, processor 35 receives power from a separate power supply than 5V power supply 20 and tolerates up to about a 20 mV difference between the voltages from separate power supplies, listed as 5V track error, while providing a suitable reading from the A/D converter related to the state of switch assembly 18. Again, changes in any of these exemplary values will affect the voltage values measured at input terminal 38 (FIG. 3).

The exemplary embodiments shown in FIG. 4 also tolerate errors related to operation of A/D converter 37. A/D converter 37 may be a ten bit A/D converter. A/D converters with other levels of resolution may also be used. In the exemplary embodiment A/D converter 37 with exemplary 10 bit resolution may have errors up to about four of the least significant bits (LSB). An exemplary A/D converter 37 may have leakage current that flows into and out of the terminal 38 and may cause a change in the voltage read by A/D converter 37. In the exemplary embodiment, switch interface 10 allows for up to about one microamp of leakage current flowing either in or out of terminal 38 while still providing a suitable interpretation of the state of switch assembly 18. The resistor values, receiver values and system values in FIG. 4 provide particularly desirable advantages for the design disclosed. In the exemplary embodiment the advantages from the particular values would not be available from other values. The particular values shown in FIG. 4, for example, allow for increased robustness and reliability as well as other advantages.

Section 406 in FIG. 4 shows exemplary values for various parameters of switch interface system 10 (FIG. 3). On the system side for embodiments shown in FIG. 4, exemplary resistances include greater than or equal to about 100 k ohms for open circuit resistance (Ropen-resistance seen in the system while a switch apparatus is open), less than or equal to about 1 ohm for harness resistance (Rharness), and less than or equal to about 100 milli-ohms for shorted resistance (Rshort). The short circuit voltage allowance (Vshort) as previously described, appears as less than or equal to about one volt for the exemplary embodiments in FIG. 4 with ten resistors or less. The exemplary embodiments with eleven or twelve resistors have a tolerance of up to about one-half volt short circuit voltage (Vshort). Nominal current at maximum resistance in the exemplary embodiments shown in FIG. 4 range from about 2.13 mA to about one mA as shown. In the exemplary embodiments shown in FIG. 4 switch interface 10 may provide suitable interpretation of switch assembly states when system variations are within the ranges shown.

Figure 5:
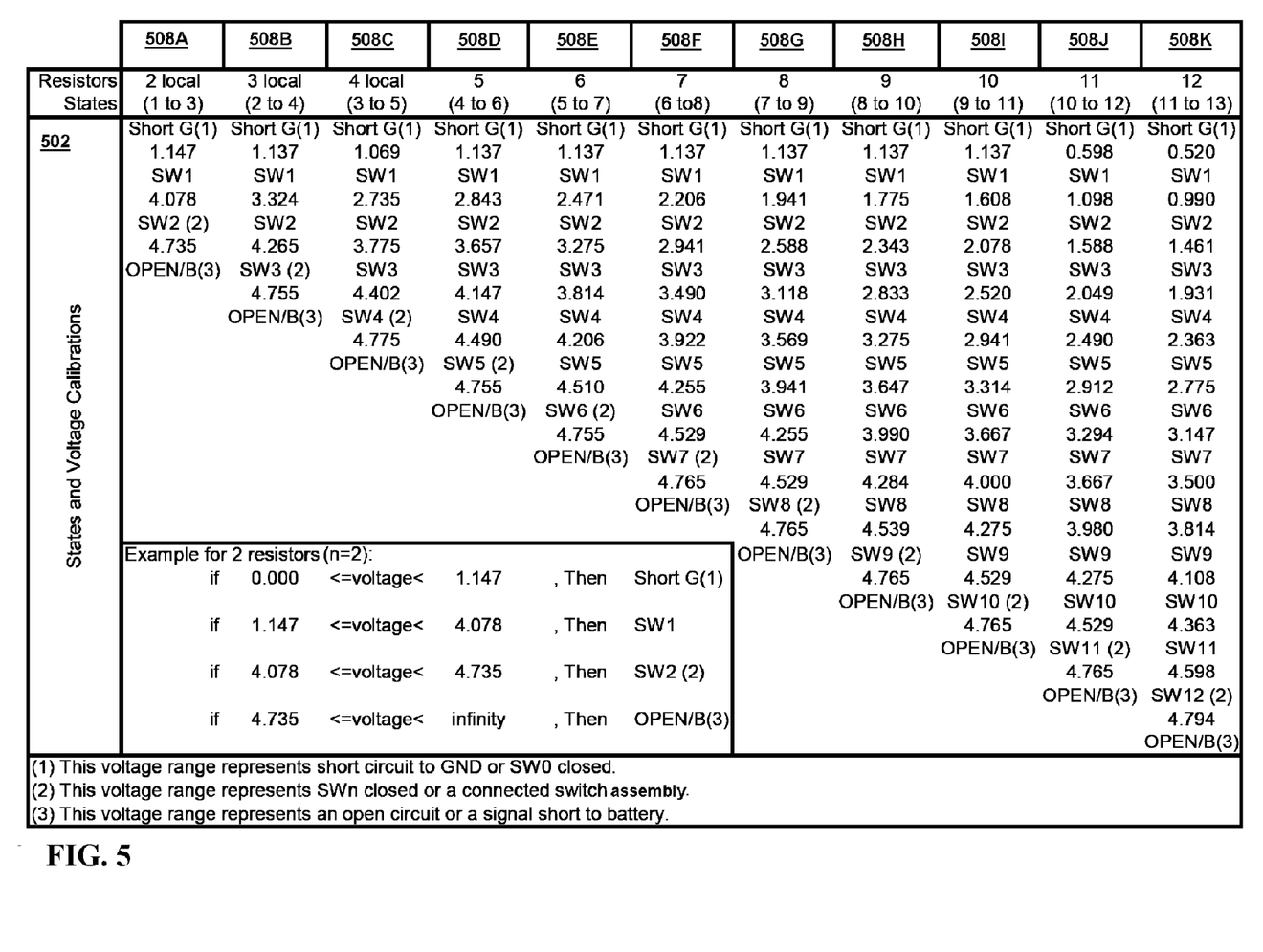
FIG. 5 is a table of exemplary calibration values for embodiments of a switching interface from FIG. 4.

FIG. 5 shows a table of alternate exemplary software calibrations in section 502 that may be stored in memory module 80 (FIG. 3). The exemplary embodiments in FIG. 5 are related to the exemplary embodiments of FIG. 4 with the number of resistors from FIG. 4 correlated to resistors in FIG. 5. The embodiment in column 408A, for example, are correlated to the calibration values in column 508A, as well as the embodiments in 408B to 408K respectively correlated to the calibration values in 508B to 508K. That is, resistors having the values as set forth in section 402 of FIG. 4 should produce voltages as set forth in FIG. 5 at terminal 38, provided that switch interface system 10 is designed in accord with the parameters set forth in sections 404, 406 of FIG. 4. Lower number switches may have larger voltage calibration ranges than the higher number switches in an embodiment because changes in voltages as shown in section 404 and 406 of FIG. 4 may have a larger effect on the voltage measured when a lower number switch is closed.

The embodiments from FIG. 4 are designed to give highest priority to the lowest number switch. If more than one switch is pressed the design of switch assembly 18 provides a resistance that is substantially equal to the lowest number switch pressed. In one exemplary embodiment, switches SW1, SW2 and SW3 may be used to operate cruise-control functions of vehicle 102. Further, switches SW4, SW5 and SW6 may be used to operate displays that display vehicle speed and other vehicle conditions, and switches SW7, SW8 and SW9 may be used to operate hands-free telephone functions. In this example the highest priority would be given to cruise-control functions, and lowest priority to the hands-free telephone functions. Many other implementations, including implementations that control additional and/or alternate features of the vehicle, could be formulated using similar concepts.

The voltage ranges in the exemplary embodiments of FIG. 5 are based on the nominal resistor values selected in FIG. 4. The selection of resistor values is based on many factors. In the exemplary embodiment, for example, selection of resistor values is based on a relationship between the selected resistor values and the voltages measured at input terminal 38 (FIG. 2) which is not a simple linear relationship. The relationship between selected nominal resistor values and voltages measured may be non-linear for many reasons, such as resistor values that vary based on a percentage basis, with higher resistor values having a larger change in ohms value for the same percentage change (e.g. 1% change). If resistor values are selected from standard resistor values, then a design change in nominal resistor value used typically results in a discrete change in measured voltage. Other non-linear relationships may include other variations that affect voltage divider circuit including pull up resistor 26, and pull down resistor 28, and the voltage measured at input terminal 38.

The calibration values in section 502 are based on the resistor values from FIG. 4 in section 402, as well as the tolerance values in sections 404 and 406. The calibration values in section 502 are based on the non-linear relationships between resistor values, system tolerances, and voltage measured by A/D converter 37 (FIG. 2). In each embodiment of FIG. 5 the lower switch states have larger voltage ranges than the higher switch states. Although the switch states have different voltage ranges, tolerance to change is substantially equal between the various switch states because the voltage ranges are based on the non-linear relationships discussed above.

An embodiment with two resistors is discussed by way of example having resistor values of about 187 ohms for resistor R1, and about 1870 ohms for resistor R2 as shown at column 408A in FIG. 4. The embodiment with two resistors may have software calibrations as shown at column 508A in FIG. 5 related to voltages read at input terminal 38. In the embodiment with two resistors, when a voltage is measured at input terminal 38 of A/D converter 37, in a range from about zero to about 1.147 volts, the voltage range may be interpreted by processor 35 as a short to ground, or switch SW0 as closed if switch SW0 is used. If the measured voltage at input terminal 38 (FIG. 2) is about 1.147 to about 4.078 volts in the embodiment with two resistors, processor 35 may determine that switch SW1 is in a closed position. Similarly, if the voltage measured is in a range of about 4.078 to about 4.735 volts, then processor 35 may determine that switch SW2 is in a closed position.

FIG. 5 contemplates various configurations of switch assembly 18 (FIG. 2). If, for example, an embodiment is used with two resistors (resistors R1 and R2) and one switch (switch SW1), with resistor R2 coupled between switch SW1 and switch assembly ground 62, then a range of about 4.078 to about 4.735 volts can be interpreted as all switches in an open state and allows processor 35 to determine that switch assembly 18 is connected to receiver module 14. In the exemplary embodiment with two resistors and one switch SW1, a range of about 4.735 volts or higher (to infinity) may represent either a failure state of a short between input node 30 and a power supply voltage, or a failure state with an open circuit between receiver 14 and switch assembly 18.

If, however, an embodiment having a configuration with resistors R1 and R2 is used with switches SW1 and SW2, a voltage range at input terminal 38 between about 4.735 volts and infinity may represent a state of switch assembly 18 with all switches in an open position. Software calibrations are also shown in FIG. 5 for exemplary embodiments with two through twelve resistors as shown in FIG. 4.

Figure 6:
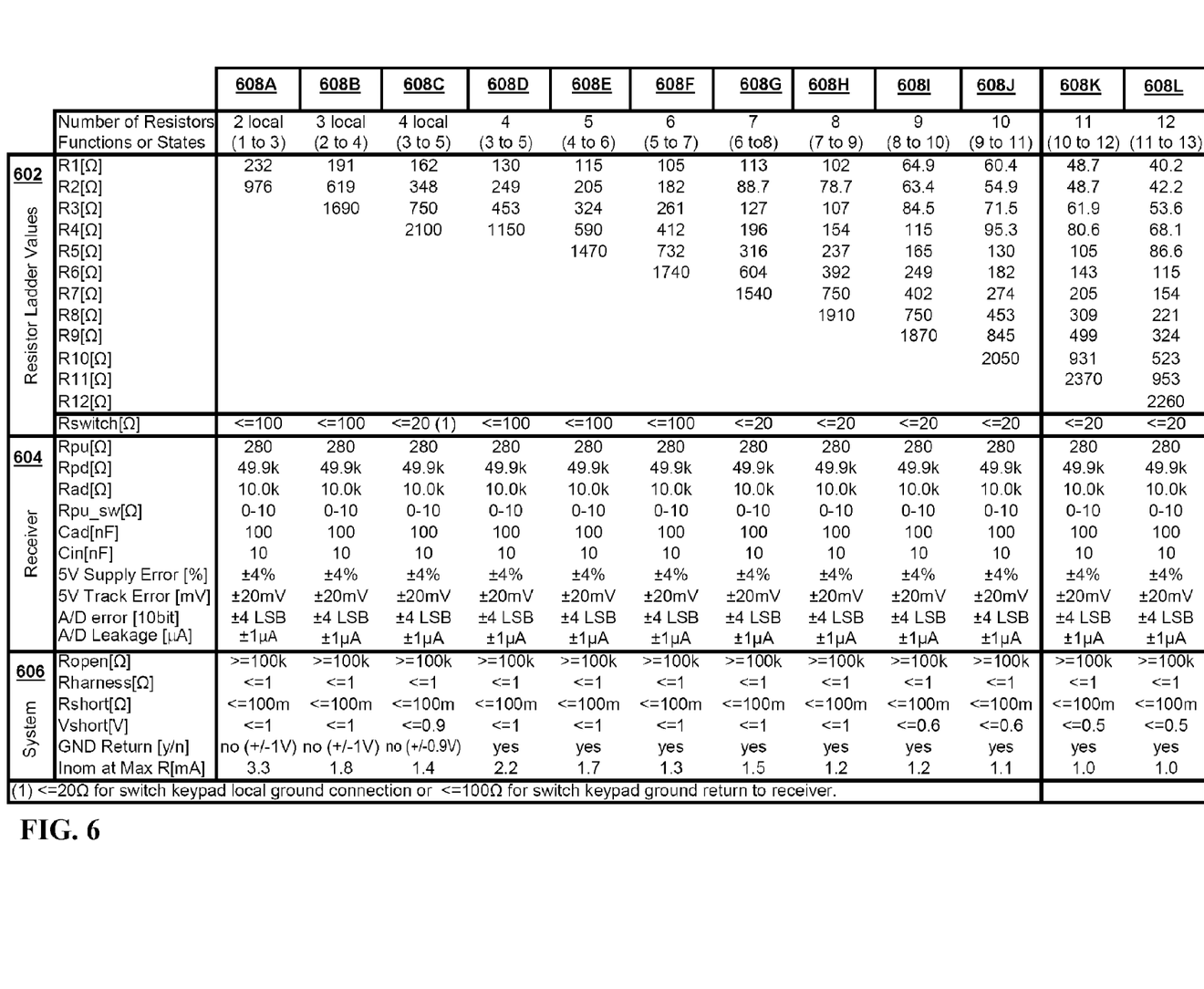
FIG. 6 is a table of exemplary values and tolerances for embodiment of a switching interface with deadband voltage ranges.

FIG. 6 shows resistor values in section 602, receiver values in section 604, and system values in section 606 in the same manner as shown in FIG. 4. The exemplary embodiments in columns 608A-L of FIG. 6 however, are designed for software calibrations having deadband voltage ranges between voltage ranges for each state of switch assembly 18 (FIGS. 2 and 3). That is, the useable switch states are separated from each other by "dead zones" that are not correlated to a switch state, in order to further improve safety, robustness and/or fault detection. FIG. 6 shows two embodiments with four resistors (R1-R4) in columns 608C and 608D, with the embodiment labeled "4 local" in column 608C as an embodiment without a direct electrical conductor between switch assembly ground 62 and receiver ground 44. The embodiments with local ground (columns 608A-C) tolerate a difference in voltage of up to about one volt due to an indirect path between switch assembly ground 62 and receiver ground 44. The resistor values, receiver values and system values in FIG. 6 provide particularly desirable advantages for the design disclosed. The advantages from the particular values would not be available from other values. The particular values shown in FIG. 4, for example, allow for increased robustness and reliability as well as other advantages.

Figure 7:
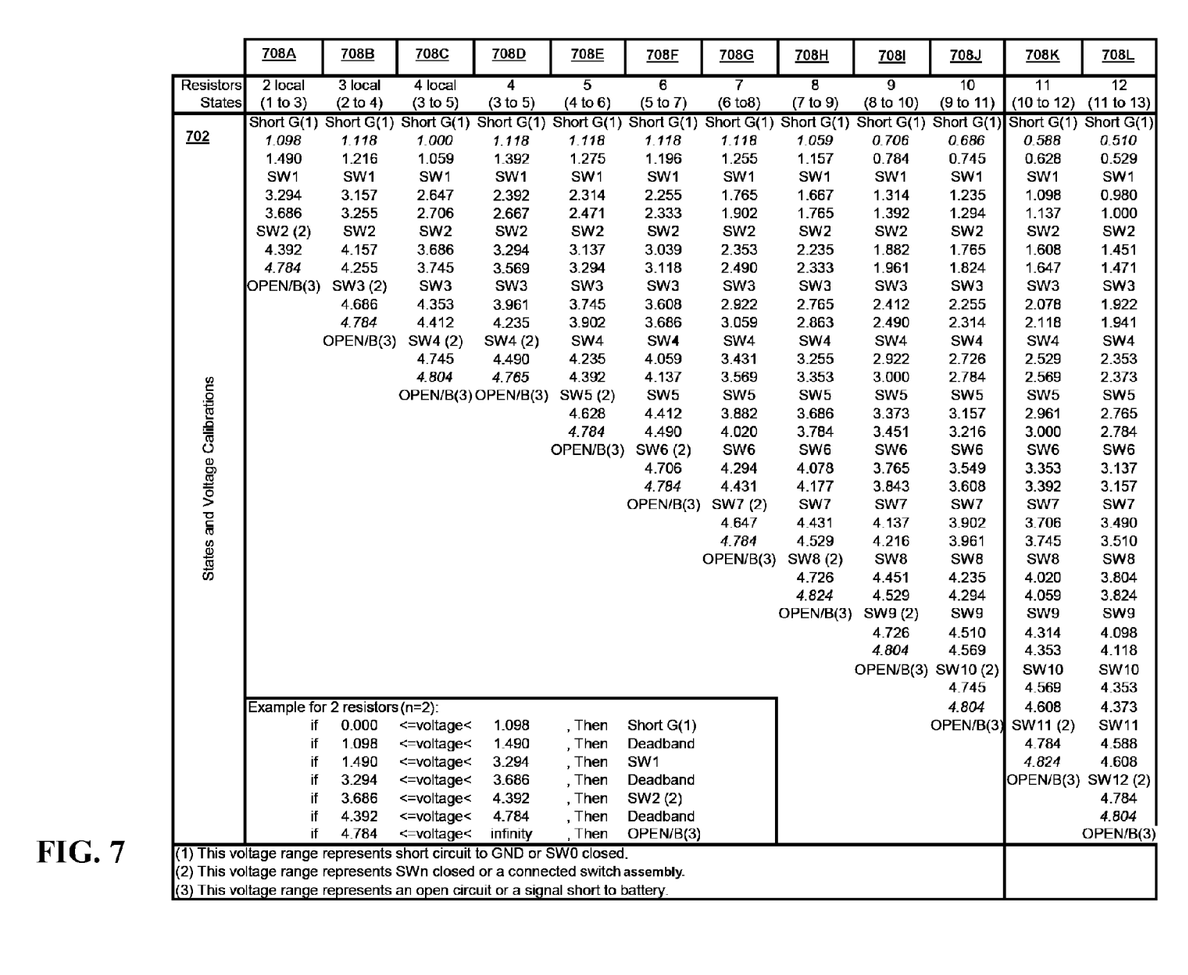
FIG. 7 is a table of exemplary calibration values including deadband voltage ranges for embodiments of a switching interface from FIG. 6.

FIG. 7 shows software calibration values in section 702 for the exemplary embodiments shown in FIG. 6 with deadband voltage ranges between voltage ranges for switch states. The calibrations in columns 708A-L are correlated to the embodiments in columns 608A-L respectively. The various switch states can be calibrated with or without so-called "deadband regions." Deadband regions are regions of the count ratio or voltage ratio that are configured so as not to indicate a switch state. The deadband regions are, as a result, "in-between" regions. The respective deadband regions can be flagged or set to a diagnostic code for a particular application. In other words, if a voltage or count ratio is observed in a deadband region, a flag or a diagnostic code may be sent to a technician so as to analyze the interface for errors. The calibrations are recorded in the processor 35 or in memory module 80, with processor 35 comparing the filtered input voltage received at terminal 38 with the reference voltage (in this case, 5V).

An example calibration for the embodiment from column 608A in FIG. 6 is shown in column 708A, and is further detailed in the lower portion of the table in FIG. 7 for the purpose of illustration. If voltage measured by A/D converter 37 is determined by processor 35 to be between about zero and about 1.098 volts, then receiver 14 registers a switch SW0 as closed, or if SW0 is not used, then this signal range represents a short circuit to ground on the receiver signal. If the voltage is determined to be about 1.49 to about 3.294 volts then processor 35 registers switch SW1 in a closed position. If the voltage is determined to be between about 3.686 and about 4.392 volts, then processor 35 registers switch SW2 in a closed position.

FIG. 7 contemplates various configurations of switch assembly 18 (FIG. 2). If, for example, the embodiment from column 708A includes one switch SW1 with the position of SW2 shorted to ground, then a measured voltage between about 3.686 and about 4.392 volts can be interpreted as all switches being in an open state. The exemplary configuration allows processor 35 to determine that switch assembly 18 is connected to receiver module 14 when all switches are open. In this configuration if the voltage is determined to be between about 4.784 or higher (up to infinity or the maximum reading from A/D converter 37), then processor 35 may register a failure state of either a short between input node 30 and a supply voltage, or a failure state of an open circuit between receiver 14 and switch assembly 18. In a configuration where the highest number switch is used as a switch (SW2 in this example), however, a measured voltage between about 4.784 or higher can be interpreted by processor 35 as all switches in an open state.

In the example comparison/respective switch state for receiver 14 (FIGS. 2 and 3) described in the lower portion of the table in FIG. 7, three deadband regions are shown between normal operating switch states. If the voltage is determined to be between about 1.098 and about 1.498 volts (voltage range between short and SW1 states), or between about 3.294 and about 3.686 (voltage range between SW1 and SW2 states), or between about 4.392 and about 4.784 (voltage range between SW2 and open states), then receiver 14 registers a deadband voltage range and may send a diagnostic signal to a user and/or a technician. Each of the embodiments shown in FIG. 7 may be practiced in a similar manner as the example explained above.

In an exemplary embodiment, resistor values and system values are chosen to meet the system tolerances. The component values shown in FIGS. 4 and 6, together with calibration values shown in FIGS. 5 and 7 provide a system that is versatile in that one receiver configuration can be implemented to provide accurate operation with a variety of different switch assembly embodiments, such as one to thirteen switch states using a single receiver. Calibration values in FIGS. 5 and 7 may provide calibration with different levels of priority, such as higher priority to lower number switches as described above. The exemplary component values may also provide increased reliability as the component values and the system conditions change over time. The component values shown in FIG. 6 with the calibration values shown in FIG. 7 allow for a system that includes deadband or diagnostic ranges between the ranges for switch states of switch assembly. Deadband regions may provide increased certainty of correct switch state determination.

Figure 8:
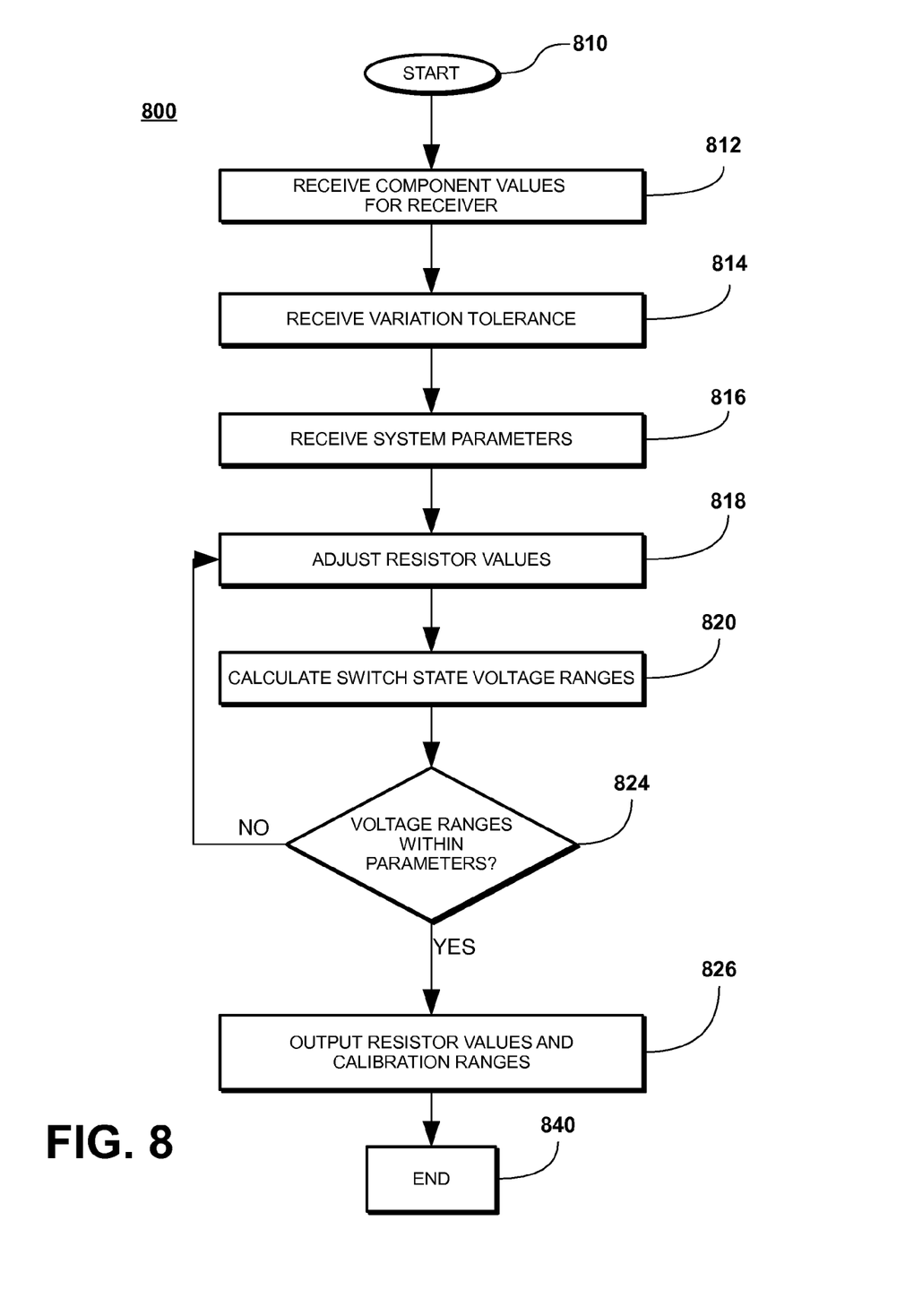
FIG. 8 is a flow chart of an exemplary method of designing a switching interface.

FIG. 8 shows a flow chart of an exemplary method 800 of designing a switch interface 10 (FIG. 2). Exemplary method 800 begins at step 810. A computer with a processor and a memory module may be used to design switching interface 10. Component values may be input and received by the computer for receiver 14 (step 812), including the resistor values of pull up resistor 26 and pull down resistor 28, the voltage value of power supply, and the resolution of A/D converter 37, as well as other components such as those discussed above. In one embodiment pull up resistor 26 is chosen with a relatively small resistive value such as about 280 ohms and pull down resistor 28 is chosen with a relatively large resistive value such as about 50,000 ohms. The voltage values selected in receiver 14 determine the voltage range available for switch states of switch assembly 18. In the exemplary circuit configuration shown in FIG. 2 the majority of voltage drop will be across pull down resistor 28 when switch assembly 18 appears as an open circuit.

Component values in switch interface 10 (FIG. 2) may vary from nominal selected values and may also vary over time. Variation in component values may cause a change in voltage values measured at input terminal 38. A range of acceptable component value variations may be selected (step 814) for some or all of the components input and received by the computer in step 812 as well as other components. Variations in the receiver may include variation in voltage from a power supply, variation between voltage of multiple power supplies, errors in an A/D converter reading, and leakage current in the A/D input terminal. Variations may also include variations in system components such as open circuit resistance, harness resistance, shorted resistance, short circuit voltage, and ground return voltage. Component value variations may be express as percentage of change, component value ranges (e.g. voltage ranges or resistor ranges), or in other ways.

In exemplary method 800 shown in FIG. 8 another step in assembling a switching interface is for the computer to receive system parameters (step 816) that are input into the computer memory. System parameters may include the total number of resistors in switch assembly 18 (FIG. 2), the total number of switches in switch assembly 18, the number of switch states in switch assembly, switch state voltage ranges, and deadband voltage ranges. As discussed previously, the number of keys such as K0-K1 (FIG. 1) that are used may determine the number of resistors (R1-R12 in FIG. 2) and switches (SW0-SW12 in FIGS. 2&3). The system parameters also include whether a shorting switch such as SW0 is used, and whether the resistor Rn that is furthest from input node 30 is coupled to ground directly, or through a switch SWn. The switch state voltage range parameters may include a minimum voltage range for each switch state, and/or substantially similar voltage ranges for each switch state. The deadband voltage range parameters may include a minimum voltage range for each deadband voltage range and/or substantially similar deadband voltage ranges. Switch state voltage parameters and deadband voltage parameters may also specify that voltage ranges do not overlap. In FIG. 7 for example, calibrations are shown in column 708L for an exemplary embodiment with twelve resistors having resistor values shown in column 608L of FIG. 6. In the exemplary embodiment the switch state voltage ranges and deadband ranges do not overlap, each switch state has a voltage range of at least about 0.150 volts, and each deadband voltage range is substantially similar at approximately 0.020 volts.

In an exemplary embodiment of method 800, the computer is used to determine resistor values in switch assembly 18 (FIG. 2) and calibration values for calibration states. The determined component values, variation tolerances, and system parameters may be input into the computer. Initial resistor values may be selected and/or adjusted (step 818) by using estimated starting values that may be calculated based on other inputs, or by random selection of resistor values within a range. Switch state voltage ranges may then be calculated based on the selected/adjusted resistor values (step 820). In the exemplary embodiment the computer determines if the calculated voltage ranges are within the parameters (step 824). If the voltage ranges are not within the parameters then one or more of the resistor values may be adjusted (step 818) and new voltage ranges may be calculated based on the adjusted resistor values (step 820). The computer may continue to adjust resistor values until the voltage ranges based on the resistor values are within the parameters. In exemplary method 800, when the computer determines that voltage ranges are within the parameters, the adjusted resistor values may be output to a memory file and/or an output device (step 826). The adjusted resistor values may be used to with calculated voltage ranges for switch states and deadband states may also be used in calibration voltage ranges for the switching interface. Exemplary method 800 ends are step 840.

The preceding description may refer to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A switching interface for use on a vehicle comprising:
   a receiver comprising:
     an input node;
     a regulated power supply electrically coupled to the input node; and
     an analog-to-digital (A/D) converter configured to measure a voltage potential between the input node and the receiver ground;
   a switch assembly comprising:
     a first resistor electrically coupled to the receiver input node, the first resistor having a first resistive value;
     a first switch electrically coupled between the first resistor and a switch assembly ground;
     a second resistor electrically coupled to the first resistor and the first switch, the second resistor having a second resistive value; and
     a second switch coupled between the second resistor and the switch assembly ground;
   wherein the first and second resistive values are selected such that the switch assembly has a separate switch assembly state for each switch with an associated voltage potential measured between the input node and ground for each of the switch assembly states.

2. The switching interface according to claim 1, wherein the first resistive value is between about 40 ohms and 230 ohms and the second resistive value is between about 40 ohms and about 1870 ohms, the switch assembly further comprising:
   a third resistor electrically coupled to the second resistor and the second switch, the third resistor having a third resistive value between about 50 ohms and about 1870 ohms; and
   a third switch coupled between the third resistor and the switch assembly ground.

3. The switching interface according to claim 2, the switch assembly further comprising:
   a fourth resistor electrically coupled to the third resistor and the third switch, the fourth resistor having a fourth resistive value between about 60 ohms and about 2100 ohms; and
   a fourth switch coupled between the fourth resistor and the switch assembly ground.

4. The switching interface according to claim 3, the switch assembly further comprising:
   a fifth resistor electrically coupled to the fourth resistor and the fourth switch, the fifth resistor having a fifth resistive value between about 80 ohms and about 1870 ohms; and
   a fifth switch coupled between the fifth resistor and the switch assembly ground.

5. The switching interface according to claim 4, the switch assembly further comprising:
   a sixth resistor electrically coupled to the fifth resistor and the fifth switch, the sixth resistor having a sixth resistive value between about 110 ohms and about 1870 ohms; and
   a sixth switch coupled between the sixth resistor and the switch assembly ground.

6. The switching interface according to claim 5, the switch assembly further comprising:
   a seventh resistor electrically coupled to the sixth resistor and the sixth switch, the seventh resistor having a seventh resistive value between about 150 ohms and about 1870 ohms; and
   a seventh switch coupled between the seventh resistor and the switch assembly ground.

7. The switching interface according to claim 6, the switch assembly further comprising:
   an eighth resistor electrically coupled to the seventh resistor and the seventh switch, the eighth resistor having an eighth resistive value between about 220 ohms and about 1910 ohms; and
   an eighth switch coupled between the eighth resistor and the switch assembly ground.

8. The switching interface according to claim 7, the switch assembly further comprising:
   a ninth resistor electrically coupled to the eighth resistor and the eighth switch, the ninth resistor having a ninth resistive value between about 320 ohms and about 1870 ohms; and
   a ninth switch coupled between the ninth resistor and the switch assembly ground.

9. The switching interface according to claim 8, the switch assembly further comprising:
   a tenth resistor electrically coupled to the ninth resistor and the ninth switch, the tenth resistor having a tenth resistive value between about 520 ohms and about 2050 ohms; and
   a tenth switch coupled between the tenth resistor and the switch assembly ground.

10. The switching interface according to claim 9, the switch assembly further comprising:
    an eleventh resistor electrically coupled to the tenth resistor and the tenth switch, the eleventh resistor having an eleventh resistive value between about 950 ohms and about 2370 ohms; and
    an eleventh switch coupled between the eleventh resistor and the switch assembly ground.

11. The switching interface according to claim 10, the switch assembly further comprising:
    a twelfth resistor electrically coupled to the eleventh resistor and the eleventh switch, the twelfth resistor having a twelfth resistive value of about 2260 ohms; and
    a twelfth switch coupled between the eleventh resistor and the switch assembly ground.

12. The switching interface according to claim 1, the switch assembly further comprising a shorting switch coupled between the input node and the switch assembly ground.

13. The switching interface according to claim 1, the receiver further comprising:
    a processor communicatively coupled to the A/D converter; and
    a data table communicatively coupled to the processor, wherein the data table contains data related to the voltage potential measured for each of the switch assembly states.

14. The switching interface according to claim 13 wherein the data in the data table defines voltage ranges for each of the switch assembly states.

15. The switching interface according to claim 14 wherein the data in the data table defines deadband ranges between the voltage ranges for each of the switch assembly states.

16. The switching interface according to claim 1 wherein the receiver further comprises:
a pull-up resistor electrically coupled between the regulated power supply and the input node, the pull up resistor having a resistive value of about 280 ohms; and
a pull down resistor electrically coupled between the input node and receiver ground having a resistive value of about 50,000 ohms.

17. The switching assembly according to claim 1 wherein the vehicle comprises a chassis, and wherein the receiver ground and the switch assembly ground are electrically connected through the vehicle chassis.

18. A receiver configured to interpret a state of a resistor ladder switch assembly, the receiver comprising:
a five volt regulated power supply having a five volt output terminal and a receiver ground reference terminal;
an input node configured to connect to the resistor ladder switch assembly, wherein a voltage that is related to the state of the resistor ladder switch assembly is measured at the input node relative to the receiver ground reference terminal;
a pull-down resistor having a nominal value of about 50,000 ohms coupled between the input node and the receiver ground reference terminal;
an analog to digital (A/D) converter having an input terminal coupled to the input node, wherein the A/D converter converts the voltage at the input node for determining the state of the resistor ladder switching network.

19. The receiver of claim 18 wherein the receiver is coupled to a switch assembly comprising:
a first resistor electrically coupled to the input node,
a second resistor electrically coupled in series with the first resistor;
a first switch electrically coupled between the first resistor and a switch assembly ground;
a second switch electrically coupled between the second resistor and the switch assembly ground.

20. A method of designing a switching interface, the switching interface comprising: a receiver and a switch assembly having multiple resistors and multiple switches, the receiver comprising: an input node; a regulated power supply electrically coupled to the input node; and an analog-to-digital (A/D) converter configured to measure a voltage potential between the input node and the receiver ground; the method comprising:
receiving component values for the receiver;
receiving component value variation tolerances for the switching interface;
receiving parameters including a total number of resistors in the switch assembly, a total number of switches in the switch assembly, switch state voltage ranges and deadbands voltage ranges between switch states of the switch assembly;
adjusting values of the resistors in the switch assembly;
calculating switch state voltage ranges based on the adjusted resistor values and the component value variation tolerances;
determining if the switching interface with the adjusted resistor values are within the parameters; and
continuing to adjust resistor values until the switching interface meets the parameters.

* * * * *